US012725654B2

(12) United States Patent
Cherif et al.

(10) Patent No.: US 12,725,654 B2
(45) Date of Patent: Sep. 1, 2026

(54) LEAKAGE COMPENSATION CIRCUIT FOR CONTENT ADDRESSABLE MEMORY (CAM) CELL

(71) Applicant: NORTHROP GRUMMAN SYSTEMS CORPORATION, Falls Church, VA (US)

(72) Inventors: Bouchaib Cherif, Yorktown Heights, NY (US); Philippe Pouliquen, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 239 days.

(21) Appl. No.: 18/430,301

(22) Filed: Feb. 1, 2024

(65) Prior Publication Data

US 2025/0252997 A1 Aug. 7, 2025

(51) Int. Cl.
*G11C 15/04* (2006.01)

(52) U.S. Cl.
CPC .................................... *G11C 15/04* (2013.01)

(58) Field of Classification Search
CPC ...................................................... G11C 15/04
See application file for complete search history.

(56) References Cited

U.S. PATENT DOCUMENTS

| | | | |
|---|---|---|---|
| 6,101,116 A | 8/2000 | Lien et al. | |
| 7,265,412 B2 | 9/2007 | Kihara | |
| 7,440,333 B2 | 10/2008 | Hsia et al. | |
| 7,701,763 B2 | 4/2010 | Roohparvar | |
| 9,484,096 B1 * | 11/2016 | Chen | G11C 15/046 |
| 2016/0300614 A1 * | 10/2016 | Nebashi | G11C 11/1675 |

OTHER PUBLICATIONS

Pending U.S. Appl. No. 18/398,876, filed Dec. 28, 2023, First named inventor: Bouchaib Cherif.

* cited by examiner

*Primary Examiner* — Douglas King
(74) *Attorney, Agent, or Firm* — KATTEN MUCHIN ROSENMAN LLP

(57) ABSTRACT

A leakage compensation content addressable memory (CAM) circuit includes at least one CAM cell configured to store a bit value, and at least one compensation CAM cell configured to store the bit value of the CAM cell and to cancel leakage current of the CAM cell. The leakage compensation CAM circuit further includes at least one main bit line driver coupled to bit lines of the CAM cell to supply output to the bit lines of the CAM cell, at least one compensation bit line driver coupled to bit lines of the compensation CAM cell to supply output to the bit lines of the compensation CAM cell, and at least one word line driver coupled to word lines to supply output to the word lines of the CAM cell and the compensation CAM cell.

20 Claims, 9 Drawing Sheets

IN
PFET 106
OUT
$V_{bias}$
NFET 107

FIG. 1D

IN
PFET 108
OUT
$V_G$
NFET 109
$V_S$

FIG. 1E

LEAKAGE COMPENSATION CIRCUIT FOR CONTENT ADDRESSABLE MEMORY (CAM) CELL

This invention was made with government support under Government Contract No. FA8650-23-C-7306 awarded by Defense Advanced Research Projects Agency (DARPA). The government has certain rights in the invention.

BACKGROUND

A content-addressable memory (CAM) is a storage structure that accesses stored content or value by content rather than by location. In addition to the writing and reading operations which memory devices such as static random access memory (SRAM) and dynamic random access memory (DRAM) provide, CAM allows parallel search operations based on content stored in CAM cell arrays.

Arrays of CAM cells are used for pattern matching operations in AI and ML inference. They allow a bit to be stored while simultaneously performing any Boolean single bit operation (depending on the wiring of the cell). Modern AI and ML problems require large data sets, which in turn requires a large number of CAM cells to be connected. However, the accuracy degrades with larger array sizes due to the leakage in the CAM cells. For example, a traditional six (6) transistor CAM cell is subject to leakage currents in the transistors that are "off." When many CAM cells are connected, these leakage currents can add up and exceed the "on" currents, resulting in erroneous calculations.

Currently, array size of the CAM cells is limited by the CAM cell leakage. For larger arrays, the output from multiple individual small arrays must be aggregated by digitizing the outputs and combining them numerically using a microprocessor or custom digital logic. This requires more power and additional resources that would be obviated if the arrays could encompass the entire problem.

SUMMARY

The disclosed invention provides a leakage compensation CAM circuit that solves the issue of leakage current described above. The leakage compensation CAM circuit of the disclosed invention includes a secondary CAM cell to compensate for the leakage of the main CAM cell to improve the calculation accuracy or allow for more cells to be connected together. By compensating for the expected leakage, the error can be reduced, or the array size of the CAM cells can be increased for the almost same accuracy level.

These advantages and others are achieved, for example, by a leakage compensation content addressable memory (CAM) circuit, which includes at least one CAM cell configured to store bit values, at least one compensation CAM cell configured to store the bit values of the CAM cell and to cancel leakage current of the CAM cell, one or more bit line drivers configured to supply output to the bit lines of the CAM cell and the compensation CAM cell, and one or more word line drivers configured to supply output to the word lines of the CAM cell and the compensation CAM cell. The CAM cell includes a first and fourth transistors that are first type transistors and a second, third, fifth and sixths transistors that are second type transistors. The compensation CAM cell includes a first and fourth transistors that are second type transistors and a second, third, fifth and sixth transistors that are first type transistors.

The first type transistor may be a p-channel field effect transistor (PFET) and the second type transistor may be an n-channel field effect transistor (NFET), or vice-versa.

The bit lines of the CAM cell may include a first, second, third and fourth bit lines. A gate of the second transistor of the CAM cell is coupled to a first word line, and a source of the second transistor is coupled to a first bit line of the CAM cell. A gate of the third transistor of the CAM cell is coupled to a second word line, and a source of the third transistor is coupled to a second bit line of the CAM cell. A gate of the fourth transistor of the CAM cell is coupled to drains of the first, second and third transistors of the CAM cell. A gate of the fifth transistor of the CAM cell is coupled to the first word line, and a source of the fifth transistor of the CAM cell is coupled to a third bit line of the CAM cell. A gate of the sixth transistor of the CAM cell is coupled to the second word line and a source of the sixth transistor of the CAM cell is coupled to a fourth bit line of the CAM cell. A gate of the first transistor of the CAM cell is coupled to drains of the fourth, fifth and sixth transistors of the CAM cell.

The bit lines of the compensation CAM cell may include a first, second, third and fourth bit lines. A gate of the second transistor of the compensation CAM cell is coupled to a third word line, and a source of the second transistor of the compensation CAM cell is coupled to a first bit line of the compensation CAM cell. A gate of the third transistor of the compensation CAM cell is coupled to a fourth word line, and a source of the third transistor of the compensation CAM cell is coupled to a second bit line of the compensation CAM cell. A gate of the fourth transistor of the compensation CAM cell is coupled to drains of the first, second and third transistors of the compensation CAM cell. A gate of the fifth transistor of the compensation CAM cell is coupled to the third word line, and a source of the fifth transistor of the compensation CAM cell is coupled to a third bit line of the compensation CAM cell. A gate of the sixth transistor of the compensation CAM cell is coupled to the fourth word line and a source of the sixth transistor of the compensation CAM cell is coupled to a fourth bit line of the compensation CAM cell. A gate of the first transistor of the compensation CAM cell is coupled to drains of the fourth, fifth and sixth transistors of the compensation CAM cell.

The one or more bit line drivers may include at least one main bit line driver coupled to the bit lines of the CAM cell to supply output to the CAM cell and at least one compensation bit line driver coupled to the bit lines of the compensation CAM cell to supply output to the compensation CAM cell.

The main bit line driver may include a first transistor, a second transistor, a third transistor, a current source coupled to a source of the second transistor and a gate of the first transistor, and an operational amplifier (OpAmp). A drain of the second transistor is coupled to a drain of the first transistor. The first and third transistors are the first type transistors and the second transistor is the second type transistor. The OpAmp may include a first input terminal coupled to the source of the second transistor, a second input terminal coupled to a bit line of the CAM cell, and an output terminal coupled to a gate of the third transistor. A source of the third transistor is coupled to the bit line of the CAM cell and a drain of the third transistor provides bit line output current.

The compensation bit line driver may include a first transistor, a second transistor, a third transistor, a current source coupled to a source of the second transistor and a gate of the first transistor, and an operational amplifier (OpAmp). A drain of the second transistor is coupled to a drain of the first transistor. The first and third transistors are the second type transistors and the second transistor is the first type transistor. The OpAmp may include a first input terminal coupled to the source of the second transistor, a second input terminal coupled to a bit line of the compensation CAM cell, and an output terminal coupled to a gate of the third transistor. A source of the third transistor is coupled to the bit line of the compensation CAM cell and a drain of the third transistor provides bit line output current.

The one or more word line drivers may be coupled to the first, second, third and fourth word lines to supply output to the word lines of the CAM cell and the compensation CAM cell, and the first and second word lines are controlled by mutually exclusive word line signals and the third and fourth word lines are controlled by mutually exclusive word line signals.

BRIEF DESCRIPTION OF THE DRAWINGS

The preferred embodiments described herein and illustrated by the drawings hereinafter are to illustrate and not to limit the invention, where like designations denote like elements.

FIG. 1D is a circuit diagram of a pseudo-PMOS inverter in a CMOS process.

FIG. 1E is a circuit diagram of a pseudo-PMOS inverter with a variable source bias.

DETAILED DESCRIPTION

Figure 1A:
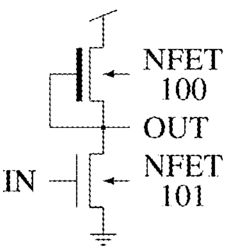
FIG. 1A is a circuit diagram of an inverter in an NMOS process.

The following detailed description is merely exemplary in nature and is not intended to limit the described embodiments or the application and uses of the described embodiments. All of the implementations described below are exemplary implementations provided to enable persons skilled in the art to make or use the embodiments of the disclosure and are not intended to limit the scope of the disclosure, which is defined by the claims. It is also to be understood that the drawings included herewith only provide diagrammatic representations of the presently preferred structures of the present invention and that structures falling within the scope of the present invention may include structures different than those shown in the drawings.

Figure 1B:
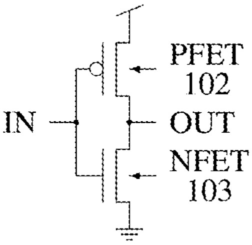
FIG. 1B is a circuit diagram of an inverter in a CMOS process.
Figure 1C:
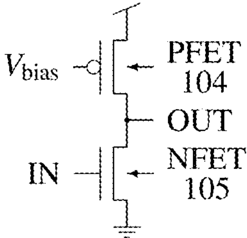
FIG. 1C is a circuit diagram of a pseudo-NMOS inverter in a CMOS process.

With reference to FIGS. 1A to 1D, shown are various implementations of digital inverters. FIG. 1A illustrates the construction of an inverter in an NMOS type process. NMOS processes have only n-channel field effect transistors (NFET) 100, 101, but provides a depletion-mode version in addition to the conventional enhancement mode version. The depletion mode NFET has its gate terminal tied to its source terminal, so that it behaves like a constant current source. The depletion mode NFET can be used as a load (i.e., a passive pull-up) when constructing various digital logic gates. Current VLSI fabrication processes are typically CMOS type, wherein all transistors are enhancement mode, but the process provides both NFET and p-channel field effect transistors (PFET). FIG. 1B illustrates a conventional inverter in a CMOS process including PFET 102 and NFET 103. CMOS processes have various advantages and disadvantages relative to NMOS processes. However, one can emulate the NMOS process inverter by using a PFET with a constant gate bias. FIG. 1C illustrates this inverter construction including PFET 104 and NFET 105, which is referred to as a pseudo-NMOS inverter. Similarly, one can apply a constant gate bias to the NFET, resulting in the pseudo-PMOS inverter including PFET 106 and NFET 107 shown in FIG. 1D.

Figures 1D, 1E:
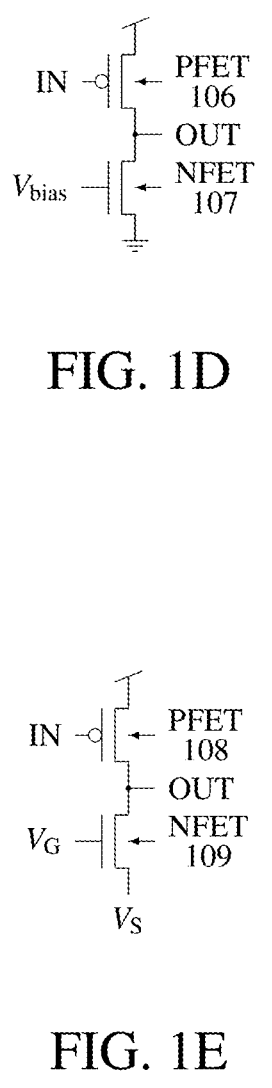

With reference to FIG. 1E, shown is a pseudo-PMOS inverter wherein the source terminal of the NFET 109 is not connected to ground (i.e., the negative power supply), but is instead connected to an arbitrary voltage Vs. If NFET 109 is operated in the subthreshold regime and the source terminal is connected to the bulk terminal, then the current Id in NFET 109 will be exponentially related to the voltages at the gate and source terminals of NFET 109. That is, $$I_D = I_0 e \frac{kV_{GS}}{v_t} = I_0 e \frac{kV_G}{v_t} e \frac{-kV_S}{v_t},$$

enabling the multiplication of the gate and source effects. Note that the current flows only when the input IN signal is low, which turns on PFET 108, and pulls the output OUT high. When the input signal IN is high, PFET 108 is off, no current flows, and NFET 109 pulls the output OUT low.

Figure 2:
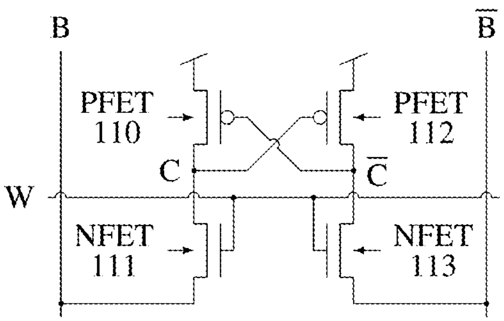
FIG. 2 is a circuit diagram of a static-RAM (random access memory) cell using two cross-coupled pseudo-PMOS inverters of FIG. 1E.

With reference to FIG. 2, shown is a static random-access memory (RAM) cell, using cross-coupled pseudo-PMOS inverters including PFET 110, 112. The bit lines B and $\overline{B}$ are connected to the source terminals of NFET 111, 113 and the word line W is connected to gate terminals of the NFET 111, 113. The state of the RAM cell can be determined by monitoring the current flow on the bit lines. When the state is one (1) (i.e., C is high and $\overline{C}$ is low), current will flow out of the source terminal of NFET 111 onto bit line B. When the stored state is zero (0) (i.e., C is low and $\overline{C}$ is high), current will flow out of the source terminal of NFET 113 onto bit line B.

Figure 3:
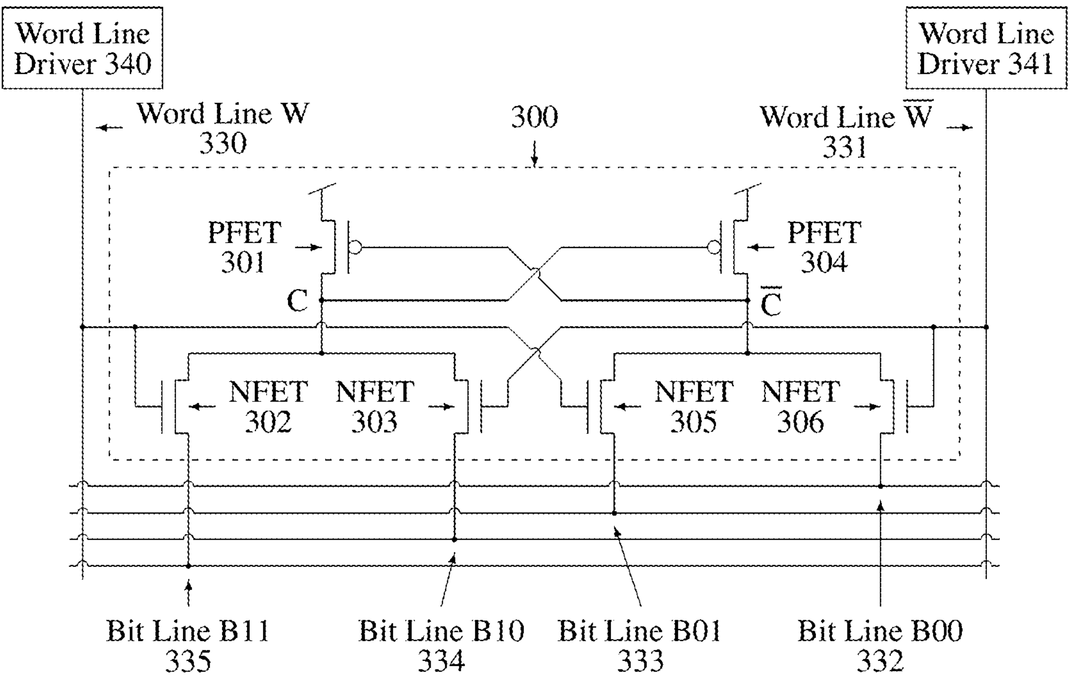
FIG. 3 is a circuit diagram of a content addressable memory (CAM) cell of the disclosed invention, based on the pseudo-PMOS inverter of FIG. 1E.

With reference to FIG. 3, shown is a diagram of a content addressable memory (CAM) cell 300 of the disclosed invention. The CAM cell 300 stores a bit value. In an embodiment of the disclosed invention, each CAM cell 300 includes six (6) transistors, among which transistors PFET 301 and 304 are p-channel metal-oxide semiconductor (PMOS) transistors and transistors NFET 302, 303, 305 and 306 are n-channel metal-oxide semiconductor (NMOS) transistors.

The transistors 301, 302 and 303 of the CAM cell 300 are configured as pseudo-PMOS inverters with input transistor 301 and dual load transistors 302 and 303, and transistors 304, 305 and 306 are also configured as pseudo-PMOS inverters with input transistor 304 and dual load transistors 305 and 306. As shown in FIG. 3, the gate of PFET 301 is coupled to the drain of PFET 304 and drains of NFETs 305 and 306. The gate of PFET 304 is coupled to the drain of PFET 301 and drains of NFETs 302 and 303. Herein, "coupled" means that elements are capable of being electrically connected.

The load transistors NFET 302, 303, 305 and 306 are controlled by two mutually exclusive input word lines W 330 and W 331. In other words, the first and second word lines 330, 331 are supplied with or controlled by mutually exclusive word line signals, such that one is at a high voltage and the other at a low voltage. The gates of NFETs 302 and 305 are coupled to the first word line W 330 and the gates of NFETs 303, 305 are coupled to the second word line W 331. The sources of NFETs 302, 303, 305, 306 are coupled to four (4) output bit lines B11 335, B10 334, B01 333, B00 332, respectively.

The four (4) output bit lines 332-335 respectively provide outputs representing four possible Boolean AND operations B00, B01, B10 and B11 between the state of the word lines and the CAM cell state: one bit line for each combination of 00, 01, 10 and 11. One output bit line among the output bit lines 332-335, which carries the unit current, is the one corresponding to the current state of the word line and the cell state. For example, if the word line state and the cell state are both one (1), then the output bit line B11 335 will have the unit current and the other three bit lines will have zero current. If the word line state is one (1) and the cell state is zero (0), the output bit line B01 333 will have the unit current and the other three bit lines will have zero current. If the word line state is zero (0) and the cell state is one (1), the output bit line B10 334 will have the unit current and the other three bit lines will have zero current. If the word line state and the cell state are both zero (0), the output bit line B00 332 will have the unit current and the other three bit lines will have zero current.

The word lines $\overline{W}$ 330 and W 331 represent a single bit, and therefore the word lines must be in one of two complementary states. Either W is at a high voltage and $\overline{W}$ is at a low voltage, or W is at a low voltage and $\overline{W}$ is at a high voltage. Furthermore, all the bit lines B00, B01, B10, B11 are at the same voltage. The word lines 330, 331 are respectively connected to word line drivers 340, 341. Any type of known word line drivers for CAM cells can be used for the CAM cell 300. For example, a novel word line driver that incorporates digital-to-analog converters (DACs), which is disclosed in U.S. patent application Ser. No. 18/398,876 filed on Dec. 28, 2023, may be used for the array of CAM cells of the disclosed invention.

The CAM cell 300 is subject to leakage currents in the transistors that are "off." When multiple CAM 300 cells are connected, these leakage currents can add up and exceed the unit current, resulting in erroneous calculations. The leakage compensation CAM circuit of the disclosed invention includes a secondary (compensation) CAM cell to compensate for the leakage currents of the main CAM cell 300 to improve the calculation accuracy or allow for more cells to be connected together.

With modern fabrication processes, the amount of leakage on the other three bit lines is becoming larger and more significant relative to the unit current. For instance, if the unit current is 1 nA and the leakage current totals 0.1 nA, then for every ten (10) CAM cells that are "off," we get a current equivalent to one "on" cell. If we have configured the CAM cell to count the number of matching bits, then on a row with ten (10) matching bits and ninety (90) mismatching bits, the computation will behave as if there were nineteen (19) matching bits (10+90/10). Although we can't reduce the leakage current, we can use two CAM cells, which include a main CAM cell and a compensating CAM cell, in such a configuration that the leakage currents cancel. This is accomplished by configuring the main CAM cell to have a main unit current of 2 nA for instance, and the compensating CAM cell to have a compensating unit current of 1 nA, and then subtracting the output currents of the compensating CAM cell from the output currents of the main CAM cell, while maintaining an effective overall unit current of 1 nA (2 nA−1 nA).

Figure 4:
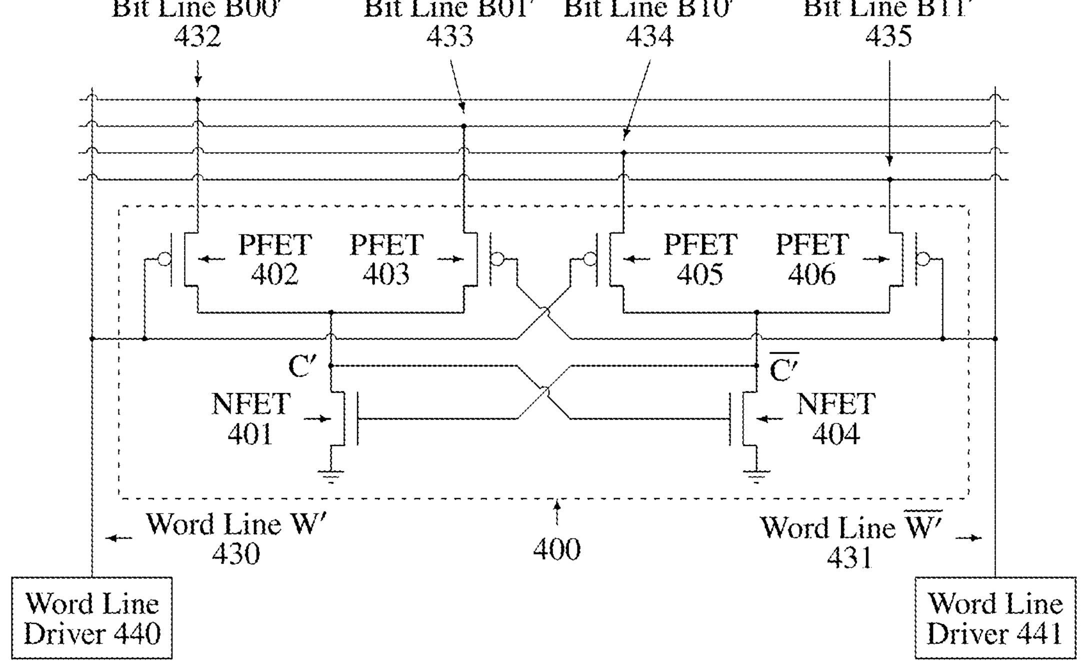
FIG. 4 is a circuit diagram of a compensation CAM cell of the disclosed invention, which is coupled to the main CAM cell shown in FIG. 3 to cancel leakage currents of the main CAM cell.

With reference to FIG. 4, shown is a diagram of a compensation CAM cell 400 of the disclosed invention, which is configured to be coupled to the CAM cell 300 to cancel leakage currents. The compensation CAM cell 400 stores the same bit value of the CAM cell 300. The CAM cell 300 is referred to as a main CAM cell while the CAM cell 400 is referred to as a compensation CAM cell. In an embodiment of the disclosed invention, each of the compensation CAM cell 400 includes six (6) transistors, among which transistors NFET 401 and 404 are NMOS transistors and transistors PFET 402, 403, 405 and 406 are PMOS transistors. As shown in FIG. 4, the gate of NFET 401 is coupled to the drain of NFET 404 and drains of PFETs 405 and 406. The gate of NFET 404 is coupled to the drain of NFET 401 and drains of PFETs 402 and 403.

The transistors PFET 402, 403, 405 and 406 are controlled by the same two mutually exclusive input word lines W' 430 and W' 431. The first and second word lines 430, 431 are supplied with or controlled by mutually exclusive word line signals, such that one is at a high voltage and the other at a low voltage. The gates of PFETs 402 and 405 are coupled to the first word line W' 430 and the gates of PFETs 403, 406 are coupled to the second word line $\overline{W}$' 431. The sources of PFETs 402, 403, 405, 406 are coupled to four (4) output bit lines B00' 432, B01' 433, B10' 434, B11' 435, respectively.

As shown in FIGS. 3 and 4, the transistors 301, 304 of the CAM cell 300 are PFET while the transistors 401, 404 of the compensation CAM cell 400 are NFET, and the transistors 302, 303, 305, 306 of the CAM cell 300 are NFET while the transistors 402, 403, 405, 406 of the compensation CAM cell 400 are PFET. The types of the transistors of the compensation CAM cell 400 are selected based on the types of the transistors of the CAM cell 300. For example, as shown in FIGS. 3 and 4, the transistors 401, 404 of the compensation CAM cell 400 are selected to have a channel type opposite to the channel type of the corresponding transistors 301, 304 of the CAM cell 300, and the transistors 402, 403, 405, 406 of the compensation CAM cell 400 are selected to have a channel type opposite to the channel type of the corresponding transistors 302, 303, 305, 306 of the CAM cell 300. Herein, the PFET may be referred to as a first type (or channel) transistor and the NFET may be referred to as a second type (or channel) transistor. Alternatively, the NFET may be referred to as a first type (or channel) transistor and the PFET may be referred to as a second type (channel) transistor. The terms of the first and second type transistors are referred to as transistors with opposite channel types.

The four (4) output bit lines 432-435 respectively provide outputs representing four possible Boolean AND operations B00', B01', B10' and B11' between the state of the word lines and the CAM cell state: one bit line for each combination of 00, 01, 10 and 11. One output bit line among the output bit lines 432-435, which carries the compensating unit current, is the one corresponding to the current state of the word line and the cell state. For example, if the word line state and the cell state are both one (1), then the output bit line B11' 435 will have the compensating unit current and the other three will have zero current. If the word line state is one (1) and the cell state is zero (0), the output bit line B1' 433 will have the compensating unit current and the other three will have zero current. If the word line state is zero (0) and the cell state is one (1), the output bit line B10' 434 will have the compensating unit current and the other three will have zero current. If the word line state and the cell state are both zero (0), the output bit line B00' 432 will have the compensating unit current and the other three will have zero current.

The word lines W' 430 and W' 431 represent a single bit, and therefore the word lines must be in one of two complementary states. Either W' is at a high voltage and W' is at a low voltage, or W' is at a low voltage and W' is at a high voltage. Furthermore, all the bit lines B11', B10', B01', B00' are at the same voltage. The word lines 430, 431 are respectively connected to word line drivers 440, 441. Any type of known word line drivers for CAM cells can be used for the CAM cell 400.

Figure 5:
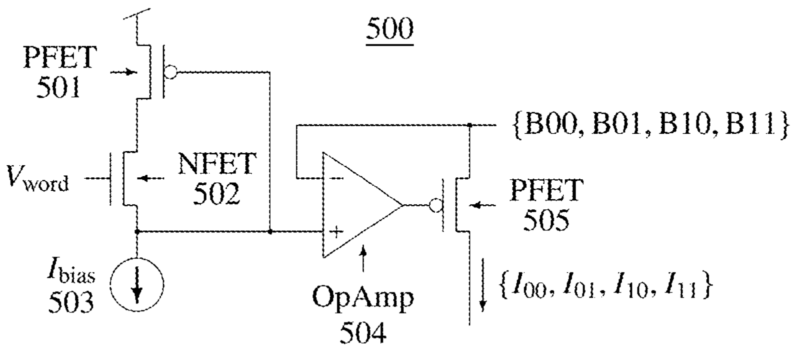
FIG. 5 is a circuit diagram of a bit line driver of the disclosed invention, which is used for the main CAM cell shown in FIG. 3.

With reference to FIG. 5, shown is a diagram of a main bit line driver 500 of the disclosed invention, which is replicated for each bit line of the main CAM cell 300 shown in FIG. 3. The bit line driver 500 of the disclosed invention includes PFET 501, NFET 502, current source 503, operational amplifier (OpAmp) 504 and PFET 505. The drain of PFET 501 is coupled to the drain of NFET 502. The source of NFET 502 is coupled to the output of current source 503 and the gate of PFET 501. Operational amplifier 504 has its non-inverting input terminal coupled to the source of NFET 502 and its inverting input terminal coupled to the source of PFET 505. The output of operational amplifier 504 is coupled to the gate of PFET 505. The current source 503 outputs a current $I_{bias}$ that sets the main unit current. PFET 505 buffers the bit lines so that the bit line currents $I_{00}$, $I_{01}$, $I_{10}$, $I_{11}$, corresponding to bit lines B00, B01, B10 and B11 respectively, can be further processed. That is, the inverting input terminal of the OpAmp 504 is coupled to a bit line of the CAM cell 300, and a drain of the PFET 505 provides the bit line output current $I_{00}$, $I_{01}$, $I_{10}$, $I_{11}$.

FIG. 5 shows an exemplary bit line driver 500 for the main CAM cell 300, but any known type of bit line drivers for CAM cells may be used. For example, a novel bit line driver that incorporates digital-to-analog converters (DACs), which is disclosed in U.S. patent application Ser. No. 18/398,876 filed on Dec. 28, 2023, may be used for the array of CAM cells of the disclosed invention.

Figure 6:
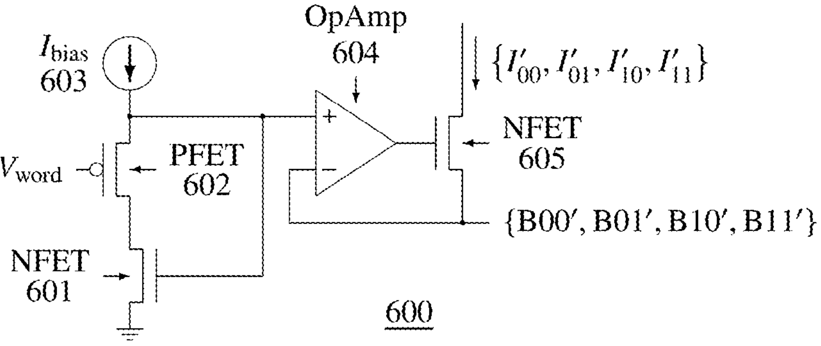
FIG. 6 is a circuit diagram of a compensation bit line driver of the disclosed invention, which is used for the compensation CAM cell shown in FIG. 4.

With reference to FIG. 6, shown is a diagram of a compensation bit line driver 600 of the disclosed invention, which is used for the compensation CAM cell 400 shown in FIG. 4. The bit line driver 600 of the disclosed invention includes NFET 601, PFET 602, current source 603, operational amplifier (OpAmp) 604 and NFET 605. The drain of NFET 601 is coupled to the drain of PFET 602. The source of PFET 602 is coupled to the output of current source 603 and the gate of NFET 601. Operational amplifier 604 has its non-inverting input coupled to the source of PFET 602 and its inverting input coupled to the source of NFET 605. The output of operational amplifier 604 is coupled to the gate of NFET 605. The current source 603 outputs a current $I_{bias}$ that sets the compensating unit current. NFET 605 buffers the bit lines so that the bit line currents $I'_{00}$, $I'_{01}$, $I'_{10}$, $I'_{11}$, corresponding to bit lines B00', B01', B10' and B11' respectively, can be further processed. That is, the inverting input terminal of the OpAmp 604 is coupled to a bit line of the compensation CAM cell 400, and a drain of the NFET 605 provides the bit line output current $I'_{00}$, $I'_{01}$, $I'_{10}$, $I'_{11}$. FIG. 6 shows an exemplary bit line driver 600 for the compensation CAM cell 400, but any known type of bit line drivers for CAM cells may be used.

As shown in FIGS. 5 and 6, the transistors 501, 505 of the bit line driver 500 are PFET while the transistors 601, 605 of the compensation bit line driver 600 are NFET, and the transistor 502 of the bit line driver 500 is NFET while the transistor 602 of the compensation bit driver 600 is PFET. The types of the transistors of the compensation bit line driver 600 are selected based on the types of the transistors of the bit line driver 500. For example, as shown in FIGS. 5 and 6, the transistors 601, 605 of the compensation bit line driver 600 are selected to have a channel type opposite to the channel type of the corresponding transistors 501, 505 of the bit line driver 500, and the transistor 602 of the compensation bit line driver 600 is selected to have a channel type opposite to the channel type of the corresponding transistor 502 of the bit line driver 500.

Figure 7:
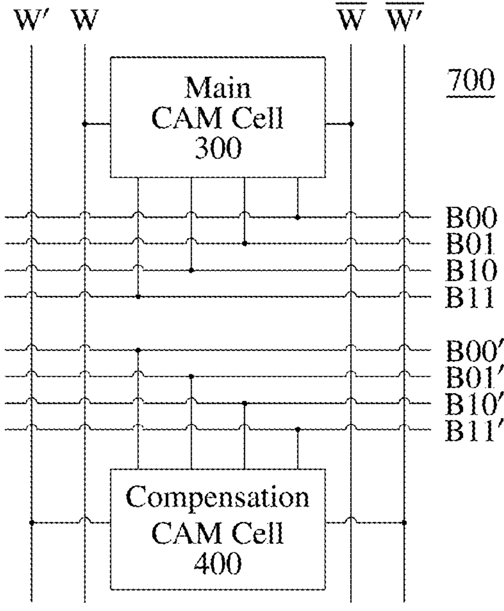
FIG. 7 is a circuit diagram of a leakage compensation CAM circuit of the disclosed invention.

With reference to FIG. 7, shown is an exemplary diagram of a leakage compensation CAM circuit 700 of the disclosed invention. The leakage compensation CAM circuit 700 includes main CAM cell 300 coupled to the word lines W 330 and W 331 (see FIG. 3) and compensation CAM cell 400 coupled to the word lines W' 430 and $\overline{W}$' 431 (see FIG. 4). Bit lines of the main CAM cell 300 are connected to bit line drivers 500 shown in FIG. 5, and bit lines of the compensation cell 400 are connected to bit line drivers 600 shown in FIG. 6.

In an embodiment, some of the bit lines may be combined. For instance, if only bit matches and mismatches are of interest, bit lines B00 332 and B11 335 may be combined into a single bit line, bit lines B01 333 and B10 334 into a single bit line, bit lines B00' 432 and B11' 435 into a single bit line, and bit lines B01' 433 and B10' 434 into a single bit line. In another embodiment, all the bit line voltages may be the same, so that the bit lines of the main CAM cell and the bit lines of the compensation CAM cell can be combined. That is, bit lines B00 332 and B00' 432 may be combined into a single bit line, bit lines B01 333 and B01' 433 into a single bit line, bit lines B10 334 and B10' 434 into a single bit line, and bit lines B11' 335 and B11' 435 into a single bit line. In this embodiment, since the main CAM cell unit current is normally larger than the compensation CAM cell unit current, only the bit line drivers 500 are needed. In yet another embodiment, the word line voltages may be the same, so that the word line may be combined. That is, word lines W 330 and W' 430 may be combined into a single word line, and word lines $\overline{W}$ 331 and $\overline{W}$' 431 may be combined into a single word line.

The device sizes in the compensating CAM cell 400 and bit line driver 600 are adjusted (increased or decreased) relative to the device sizes in the main CAM cell 300 and bit line driver 500 until the leakage currents are the same. Since the compensation unit is set by bias current 603, the size adjustment doesn't affect the compensation unit current, so the bit line currents of the two cells can be subtracted one-to-one. That is, $I'_{00}$ is subtracted from $I_{00}$, $I'_{01}$ is subtracted from $I_{01}$, $I'_{10}$ is subtracted from $I_{10}$, and $I'_{11}$ is subtracted from $I_{11}$. In the example where the main unit current is 2 nA and the compensation unit current is 1 nA, the current subtraction will result in a zero leakage current but a 1 nA (2 nA-1 nA) unit current. A person skilled in the art will recognize that for the leakage compensation to work properly, the main CAM cell and the compensation CAM cell should be programmed to the same state, and the word lines should also be in the same state, so that the main unit current and the compensation unit current are always output on the bit lines whose currents are being subtracted.

Figure 8:
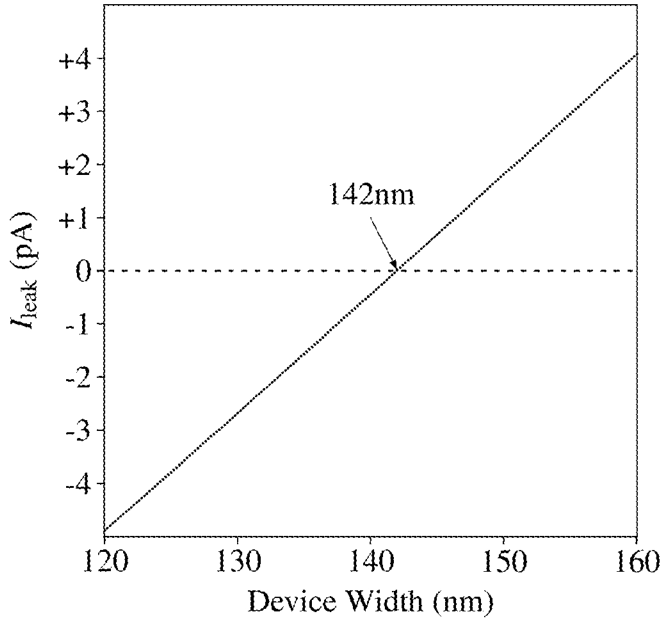
FIG. 8 is a simulation result of the effect of device size on the leakage current.

With reference to FIG. 8, shown is a simulation result of the effect of device size on the leakage current. In this example, only the device widths in the compensation CAM cell 400 and the bit line driver 600 were varied. From this result, it is determined that the optimum device width is 142 nm. In other embodiments, the device lengths may be varied (with or without variation in the device lengths), or the device threshold may be varied also.

Figure 9:
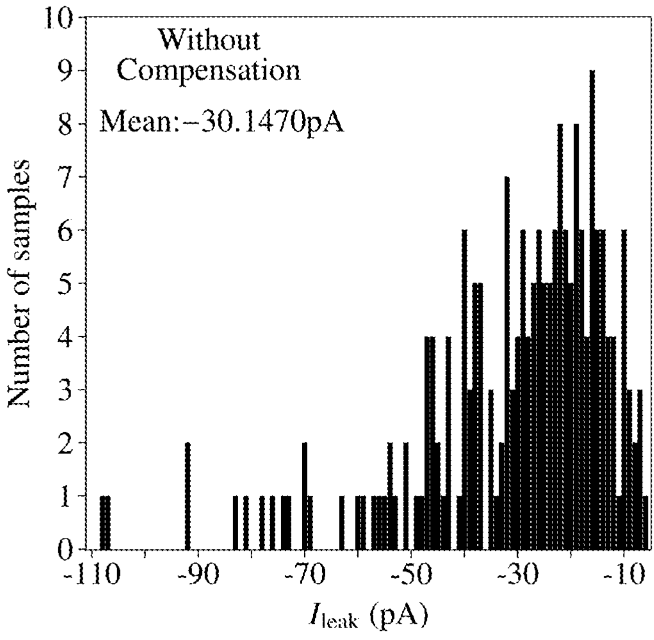
FIG. 9 is a simulation result of the CAM circuit without compensation.
Figure 10:
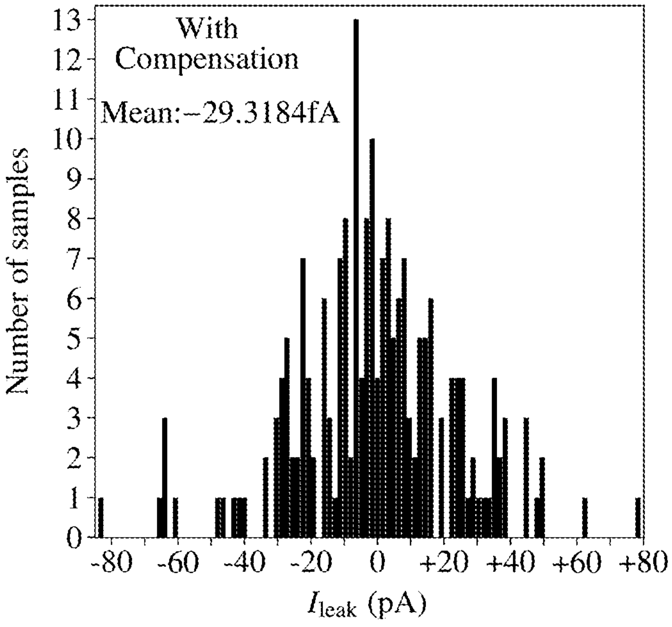
FIG. 10 is a simulation result of the CAM circuit with compensation.

With reference to FIGS. 9 and 10, shown are simulation results of the CAM circuits without compensation (FIG. 9) and with compensation (FIG. 10). FIG. 9 shows the histogram of a 200 point Monte Carlo simulation of the total leakage from a single main CAM cell. FIG. 10 shows a histogram of a 200 point Monte Carlo simulation of the combined leakage currents from a single main CAM cell with a single compensation CAM cell, using the optimum device width determined from FIG. 8. The mean leakage current dropped from 30 pA to 29 fA, which indicates a 1000 times improvement.

Since many modifications, variations, and changes in detail can be made to the described preferred embodiments of the invention, it is intended that all matters in the foregoing description and shown in the accompanying drawings be interpreted as illustrative and not in a limiting sense. Consequently, the scope of the invention should be determined by the appended claims and their legal equivalents.

What is claimed is:

1. A leakage compensation content addressable memory (CAM) circuit, comprising:
- at least one CAM cell configured to store a bit value, wherein the CAM cell comprises a first CAM cell transistor and a fourth CAM cell transistor that are first type transistors and a second CAM cell transistor, a third CAM cell transistor, a fifth CAM cell transistor and a sixth CAM cell transistor that are second type transistors;
- at least one compensation CAM cell configured to store the bit value of the CAM cell and to cancel leakage current of the CAM cell, wherein the compensation CAM cell comprises a first compensation CAM cell transistor and a fourth compensation CAM cell transistor that are second type transistors and a second compensation CAM cell transistor, a third compensation CAM cell transistor, a fifth compensation CAM cell transistor and a sixth compensation CAM cell transistor that are first type transistors;
- one or more bit line drivers configured to supply output to bit lines of the CAM cell and the compensation CAM cell; and
- one or more word line drivers configured to supply output to word lines of the CAM cell and the compensation CAM cell.

2. The leakage compensation CAM circuit of claim 1 wherein the first type transistor is a p-channel field effect transistor (PFET) and the second type transistor is an n-channel field effect transistor (NFET), or wherein the first type transistor is the NFET and the second type transistor is the PFET.

3. The leakage compensation CAM circuit of claim 1 wherein the one or more bit line drivers comprises:
- at least one main bit line driver coupled to the bit lines of the CAM cell to supply output to the CAM cell; and
- at least one compensation bit line driver coupled to the bit lines of the compensation CAM cell to supply output to the compensation CAM cell.

4. The leakage compensation CAM circuit of claim 1 wherein the bit lines of the CAM cell comprise a first bit line, a second bit line, a third bit line and a fourth bit line, and wherein:
- a gate of the second CAM cell transistor is coupled to a first word line, and a source of the second CAM cell transistor is coupled to the first bit line of the CAM cell;
- a gate of the third CAM cell transistor is coupled to a second word line, and a source of the third CAM cell transistor is coupled to the second bit line of the CAM cell,
- a gate of the fourth CAM cell transistor is coupled to drains of the first, second and third CAM cell transistors of the CAM cell;
- a gate of the fifth CAM cell transistor is coupled to the first word line, and a source of the fifth CAM cell transistor is coupled to the third bit line of the CAM cell; and
- a gate of the sixth CAM cell transistor is coupled to the second word line and a source of the sixth CAM cell transistor is coupled to the fourth bit line of the CAM cell, and wherein a gate of the first CAM cell transistor is coupled to drains of the fourth, fifth and sixth CAM cell transistors of the CAM cell.

5. The leakage compensation CAM circuit of claim 4 wherein the bit lines of the compensation CAM cell comprise a first bit line, a second bit line, a third bit line and a fourth bit line, and wherein:
- a gate of the second compensation CAM cell transistor is coupled to a third word line, and a source of the second compensation CAM cell transistor is coupled to the first bit line of the compensation CAM cell;
- a gate of the third compensation CAM cell transistor is coupled to a fourth word line, and a source of the third compensation CAM cell transistor is coupled to the second bit line of the compensation CAM cell;
- a gate of the fourth compensation CAM cell transistor is coupled to drains of the first, second and third compensation CAM cell transistors;
- a gate of the fifth compensation CAM cell transistor is coupled to the third word line, and a source of the fifth compensation CAM cell transistor is coupled to the third bit line of the compensation CAM cell; and
- a gate of the sixth compensation CAM cell transistor is coupled to the fourth word line and a source of the sixth compensation CAM cell transistor is coupled to the fourth bit line of the compensation CAM cell, and wherein a gate of the first compensation CAM cell transistor is coupled to drains of the fourth, fifth and sixth compensation CAM cell transistors.

6. The leakage compensation CAM circuit of claim 5 wherein the first and fourth bit lines of the CAM cell are combined into a single line, the second and third bit lines of the CAM cell are combined into a single line, the first and fourth bit lines of the compensation CAM cell are combined into a single line, and the second and third bit lines of the compensation CAM cell are combined into a single line.

7. The leakage compensation CAM circuit of claim 5 wherein the first bit lines of the CAM cell and the compensation CAM cell are combined into a single line, the second bit lines of the CAM cell and the compensation CAM cell are combined into a single line, the third bit lines of the CAM cell and the compensation CAM cell are combined into a single line, and the fourth bit lines of the CAM cell and the compensation CAM cell are combined into a single line.

8. The leakage compensation CAM circuit of claim 5 wherein the one or more word line drivers are coupled to the first, second, third and fourth word lines to supply output to the word lines of the CAM cell and the compensation CAM cell, and wherein the first and second word lines are controlled by mutually exclusive word line signals, and the third and fourth word lines are controlled by mutually exclusive word line signals.

9. The leakage compensation CAM circuit of claim 5 wherein the first and third word lines are combined into a single line and the second and fourth word lines are combined into a single line.

10. The leakage compensation CAM circuit of claim 4 wherein the sources of the second, third, fifth and sixth CAM cell transistors provide outputs representing Boolean operations between a state of the word lines and a state of the CAM cell.

11. The leakage compensation CAM circuit of claim 1 wherein the one or more bit line drivers comprise at least one main bit line driver configured to supply output to the bit lines of the CAM cell, and wherein the main bit line driver comprises:

a first transistor;

a second transistor, wherein a drain of the second transistor is coupled to a drain of the first transistor;

a third transistor, wherein the first and third transistors are the first type transistors and the second transistor is the second type transistor;

a current source coupled to a source of the second transistor and a gate of the first transistor; and an operational amplifier (OpAmp) comprising:

a first input terminal coupled to the source of the second transistor;

a second input terminal coupled to a bit line of the CAM cell; and an output terminal coupled to a gate of the third transistor, wherein a source of the third transistor is coupled to the bit line of the CAM cell and wherein a drain of the third transistor provides bit line output current.

12. The leakage compensation CAM circuit of claim 11 wherein the at least one main bit line driver is further coupled to the bit lines of the compensation CAM cell and configured to supply output to the bit lines of the compensation CAM cell.

13. The leakage compensation CAM circuit of claim 1 wherein the one or more bit line drivers comprise at least one compensation bit line driver configured to supply output to the bit lines of the compensation CAM cell, and wherein the compensation bit line driver comprises:

a first transistor;

a second transistor, wherein a drain of the second transistor is coupled to a drain of the first transistor;

a third transistor, wherein the first and third transistors are the second type transistors and the second transistor is the first type transistor;

a current source coupled to a source of the second transistor and a gate of the first transistor; and an operational amplifier (OpAmp) comprising:

a first input terminal coupled to the source of the second transistor;

a second input terminal coupled to a bit line of the compensation CAM cell; and an output terminal coupled to a gate of the third transistor, wherein a source of the third transistor is coupled to the bit line of the compensation CAM cell and wherein a drain of the third transistor provides bit line output current.

14. A leakage compensation content addressable memory (CAM) circuit, comprising:

at least one CAM cell configured to store a bit value; and at least one compensation CAM cell configured to store the bit value of the CAM cell and to cancel leakage current of the CAM cell, wherein:

the CAM cell comprises:

a first CAM cell transistor;

a second CAM cell transistor, wherein a gate of the second CAM cell transistor is coupled to a first word line, and a source of the second CAM cell transistor is coupled to a first bit line of the CAM cell;

a third CAM cell transistor, wherein a gate of the third CAM cell transistor is coupled to a second word line, and a source of the third CAM cell transistor is coupled to a second bit line of the CAM cell;

a fourth CAM cell transistor, wherein a gate of the fourth CAM cell transistor is coupled to drains of the first, second and third CAM cell transistors;

a fifth CAM cell transistor, wherein a gate of the fifth CAM cell transistor is coupled to the first word line, and a source of the fifth CAM cell transistor is coupled to a third bit line of the CAM cell; and a sixth CAM cell transistor, wherein a gate of the sixth CAM cell transistor is coupled to the second word line and a source of the sixth CAM cell transistor is coupled to a fourth bit line of the CAM cell, and wherein a gate of the first CAM cell transistor is coupled to drains of the fourth, fifth and sixth CAM cell transistors, wherein the first and fourth CAM cell transistors are first type transistors and the second, third, fifth and sixth CAM cell transistors are second type transistors; and the compensation CAM cell comprises:

a first compensation CAM cell transistor;

a second compensation CAM cell transistor, wherein a gate of the second compensation CAM cell transistor is coupled to a third word line, and a source of the second compensation CAM cell transistor is coupled to a first bit line of the compensation CAM cell;

a third compensation CAM cell transistor, wherein a gate of the third compensation CAM cell transistor is coupled to a fourth word line, and a source of the third compensation CAM cell transistor is coupled to a second bit line of the compensation CAM cell, a fourth compensation CAM cell transistor, wherein a gate of the fourth compensation CAM cell transistor is coupled to drains of the first, second and third compensation CAM cell transistors;

a fifth compensation CAM cell transistor, wherein a gate of the fifth compensation CAM cell transistor is coupled to the third word line, and a source of the fifth compensation CAM cell transistor is coupled to a third bit line of the compensation CAM cell; and a sixth compensation CAM cell transistor, wherein a gate of the sixth compensation CAM cell transistor is coupled to the fourth word line and a source of the sixth compensation CAM cell transistor is coupled to a fourth bit line of the compensation CAM cell, and wherein a gate of the first compensation CAM cell transistor is coupled to drains of the fourth, fifth and sixth compensation CAM cell transistors, wherein the first and fourth compensation CAM cell transistors are the second type transistors and the second, third, fifth and sixth compensation CAM cell transistors are the first type transistors.

15. The leakage compensation CAM circuit of claim 14 wherein the first type transistor is a p-channel field effect transistor (PFET) and the second type transistor is an n-channel field effect transistor (NFET), or wherein the first type transistor is the NFET and the second type transistor is the PFET.

16. The leakage compensation CAM circuit of claim 14 further comprising:

at least one main bit line driver coupled to one or more of the first, second, third and fourth bit lines of the CAM cell to supply output to the bit lines of the CAM cell; and at least one compensation bit line driver coupled to one or more of the first, second, third and fourth bit lines of the compensation CAM cell to supply output to the bit lines of the compensation CAM cell.

17. The leakage compensation CAM circuit of claim 16 wherein the main bit line driver comprises:

a first transistor;

a second transistor, wherein a drain of the second transistor is coupled to a drain of the first transistor;

a third transistor, wherein the first and third transistors are the first type transistors and the second transistor is the second type transistor;

a current source coupled to a source of the second transistor and a gate of the first transistor; and an operational amplifier (OpAmp) comprising:

a first input terminal coupled to the source of the second transistor;

a second input terminal coupled to a bit line of the CAM cell; and an output terminal coupled to a gate of the third transistor, wherein a source of the third transistor is coupled to the bit line of the CAM cell and wherein a drain of the third transistor provides bit line output current.

18. The leakage compensation CAM circuit of claim 16 wherein the compensation bit line driver comprises:

a first transistor;

a second transistor, wherein a drain of the second transistor is coupled to a drain of the first transistor;

a third transistor, wherein the first and third transistors are the second type transistors and the second transistor is the first type transistor;

a current source coupled to a source of the second transistor and a gate of the first transistor; and an operational amplifier (OpAmp) comprising:

a first input terminal coupled to the source of the second transistor;

a second input terminal coupled to a bit line of the compensation CAM cell; and an output terminal coupled to a gate of the third transistor, wherein a source of the third transistor is coupled to the bit line of the compensation CAM cell and wherein a drain of the third transistor provides bit line output current.

19. The leakage compensation CAM circuit of claim 14 further comprising one or more word line drivers coupled to the first, second, third and fourth word lines and configured to supply outputs to the word lines of the CAM cell and the compensation CAM cell, wherein the first and second word lines are controlled by mutually exclusive word line signals, and the third and fourth word lines are controlled by mutually exclusive word line signals.

20. The leakage compensation CAM circuit of claim 14 wherein the sources of the second, third, fifth and sixth CAM cell transistors provide outputs representing Boolean operations between a state of the word lines and a state of the CAM cell.

* * * * *